(12) United States Patent
Madsen et al.

(10) Patent No.: US 10,483,092 B2
(45) Date of Patent: Nov. 19, 2019

(54) BAFFLE PLATE AND SHOWERHEAD ASSEMBLIES AND CORRESPONDING MANUFACTURING METHOD

(71) Applicant: Lam Research Corporation, Fremont, CA (US)

(72) Inventors: Eric Russell Madsen, Aloha, OR (US); Lance Dyrdahl, West Linn, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 347 days.

(21) Appl. No.: 15/097,600

(22) Filed: Apr. 13, 2016

(65) Prior Publication Data

US 2017/0301515 A1    Oct. 19, 2017

(51) Int. Cl.
*H01J 37/32* (2006.01)
*C23C 16/455* (2006.01)
*B23K 20/12* (2006.01)

(52) U.S. Cl.
CPC .... *H01J 37/3244* (2013.01); *C23C 16/45565* (2013.01); *C23C 16/45591* (2013.01); *H01J 37/32091* (2013.01); *H01J 37/32449* (2013.01); *H01J 37/32633* (2013.01); *B23K 20/122* (2013.01); *B23K 20/127* (2013.01); *H01J 2237/327* (2013.01); *H01J 2237/334* (2013.01); *H01J 2237/3321* (2013.01)

(58) Field of Classification Search
CPC ............. H01J 37/3244; H01J 37/32091; H01J 37/32633; H01J 2237/327; H01J 2237/3321; H01J 2237/334; C23C 16/45565; B23K 20/127
See application file for complete search history.

(56) References Cited

U.S. PATENT DOCUMENTS

| 2,950,063 | A | * | 8/1960 | Ripley, Jr. | ............... | E03C 1/084 239/407 |
| 3,831,860 | A | * | 8/1974 | Gullaksen | ................ | B05B 1/30 239/500 |
| 5,397,060 | A | * | 3/1995 | Maas | .................... | B05B 7/0062 239/333 |

(Continued)

FOREIGN PATENT DOCUMENTS

| JP | 2007165849 A | 6/2007 |
| KR | 10-2001-0113315 A | 12/2001 |
| KR | 10-2014-0011364 A | 1/2014 |

OTHER PUBLICATIONS

First Korean Office Action dated May 28, 2019 for Korean Application No. 10-2017-0047208; 5 pages.

*Primary Examiner* — Christopher S Kim

(57) ABSTRACT

A baffle plate assembly including a baffle plate, a ring and support members. The baffle plate has an outer diameter and configured to distribute gases through a showerhead of a showerhead assembly of a substrate processing system. The gases are received from a stem of the showerhead assembly. The ring has an inner diameter and configured to be disposed in a ring channel of the showerhead assembly. The inner diameter is greater than the outer diameter of the baffle plate. The support members extend from the baffle plate to the ring. The ring and the support members hold the baffle plate in a position between a top plate and a bottom plate of the showerhead.

25 Claims, 14 Drawing Sheets

(56) References Cited

U.S. PATENT DOCUMENTS

| | | | | |
|---|---|---|---|---|
| 5,451,435 | A * | 9/1995 | Yu | C23C 16/04 |
| | | | | 257/E21.241 |
| 5,549,822 | A * | 8/1996 | Ferguson | B01D 29/055 |
| | | | | 210/238 |
| 5,836,520 | A * | 11/1998 | Bhandarkar | H01L 21/4853 |
| | | | | 239/553.5 |
| 6,415,736 | B1 * | 7/2002 | Hao | H01L 21/67017 |
| | | | | 118/723 E |
| 7,476,291 | B2 * | 1/2009 | Wang | H01J 37/00 |
| | | | | 156/345.33 |
| 2015/0225854 | A1 | 8/2015 | Madsen | |
| 2015/0315706 | A1 * | 11/2015 | Chandrasekharan | |
| | | | | C23C 16/45565 |
| | | | | 156/345.34 |
| 2016/0340782 | A1 * | 11/2016 | Chandrasekharan | |
| | | | | C23C 16/45565 |

* cited by examiner

BAFFLE PLATE AND SHOWERHEAD ASSEMBLIES AND CORRESPONDING MANUFACTURING METHOD

FIELD

The present disclosure relates to substrate processing systems, and more particularly to baffle plates of showerhead assemblies in plasma chambers of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes include, but are not limited to, chemical vapor deposition (CVD), atomic layer deposition (ALD), and/or other etch, deposition, and cleaning processes. A substrate may be arranged on a substrate support such as a pedestal, an electrostatic chuck (ESC), etc. in a processing chamber of the substrate processing system. Different gas mixtures including one or more precursors may be introduced into the processing chamber and plasma may be used to actuate chemical reactions.

The processing chamber typically includes a showerhead assembly, which is used to deliver the gas mixtures, and can be used as an electrical power conductor to the gas mixture. A showerhead assembly can include a stem with an internal channel through which the gases and precursors are supplied. The gases and precursors are received at a first end of the stem and provided to a showerhead at a second end of the stem. The showerhead can include a baffle plate, which is used to restrict, distribute and/or mix the gases and precursors within the showerhead. The electrical power applied to the showerhead can be used to generate plasma between the showerhead and the substrate support, or other aspects of the substrate processing system that require electrical power.

FIG. 1 shows a traditional baffle plate 10 and corresponding stem 12 and top plate 14 of a portion 16 of a showerhead assembly. The portion 16 is shown rotated 180°, such that the portion 16 is upside down. The showerhead assembly includes a showerhead that includes the top plate 14 and a bottom plate (may be referred to as a gas lens or faceplate). The bottom plate is not shown and extends below and parallel to the top plate 14. The stem 12 is cylindrically-shaped and includes an inner channel 22 for gases and precursors to pass to the showerhead plenum (or the space between the top and bottom plates). The baffle plate 10 is disc-shaped and can be perforated to include holes 24. The baffle plate 10 is held by standoff members 26 in a suspended position between an end 34 of the stem 12 and the bottom plate. The standoff members 26 extend from the stem 12 and/or the bottom plate in a direction parallel to a longitudinal center line (or axis) 28 of the stem 12 and are welded to the baffle plate 10. The end 34 of the stem 12 near the top plate 14 is welded to the top plate 14 to provide an inner stem weld 30. The inner stem weld 30 is circular and extends along and is attached to an inner circumferential surface 32 of the top plate 14 and the end 34 of the stem 12.

Weld finishing and surface clean-up is performed to the baffle plate 10 subsequent to the welding of the standoff members 26.

Due to a low volume and flow rates of gases passing through ALD showerheads, baffle plates (e.g., the baffle plate 10) of the ALD showerheads tend to have a small diameter (e.g., less than 1.0 inches). This results in the standoff members having a diameter of, for example, 0.05 inches. Due to the small diameter of the standoff members, it can be difficult to weld the baffle plate to the standoff members. Also, due to the small size of the baffle plate, the welding of the baffle plate to the standoff members and cleanup of the welds can damage the baffle plate. The welding can warp the baffle plate and/or cause cracking near the holes of the baffle plate. Also, a surface of the baffle plate may be inadvertently damaged during grinding of the welds during cleanup, which can negatively affect the surface of the baffle plate. This can be due to slipped, uncontrolled and/or inaccurately controlled movement of tools during cleanup. The grinding can result in geometrical degradation of the baffle plate, the baffle plate having a course surface, and/or generation of particles that need to be removed. In addition, the welding of the baffle plate to the standoff members typically includes introduction of filler material, which can be susceptible to fluorine attack and degradation during use of the baffle plate.

SUMMARY

A baffle plate assembly is provided and includes a baffle plate, a ring and support members. The baffle plate has an outer diameter and configured to distribute gases through a showerhead of a showerhead assembly of a substrate processing system. The gases are received from a stem of the showerhead assembly. The ring has an inner diameter and configured to be disposed in a ring channel of the showerhead assembly. The inner diameter is greater than the outer diameter of the baffle plate. The support members extend from the baffle plate to the ring. The ring and the support members hold the baffle plate in a position between a top plate and a bottom plate of the showerhead.

In other features, a method is provided and includes: forming a top plate for a showerhead of a showerhead assembly of a substrate processing system; forming a stem of the showerhead assembly; forming a baffle plate assembly including a baffle plate, a ring and support members, where the support members extend from the baffle plate to the ring; sliding the top plate on to the stem; placing the ring in a ring channel of the showerhead assembly to suspend the baffle plate between (i) the stem or the top plate of the showerhead, and (ii) a bottom plate of the showerhead; and locking the ring in the ring channel.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Showerhead assemblies including baffle plates and corresponding support members, stems, and top plates are disclosed herein. The baffle plates are supported, such that no welding is required to the baffle plates. This eliminates the need for cleanup of welds to baffle plates and the use of filler material in welds of baffle plates. The baffle plates are supported by lateral spanning support members and rings. The rings may be friction stir welded to corresponding stems and top plates providing stronger welds than welds associated with traditional baffle plates. Since there is no welding to the baffle plates, a need for cleaning up welds to baffle plates is eliminated and the potential for fluorine attack and degradation during use of the baffle plates is reduced.

Figure 1:
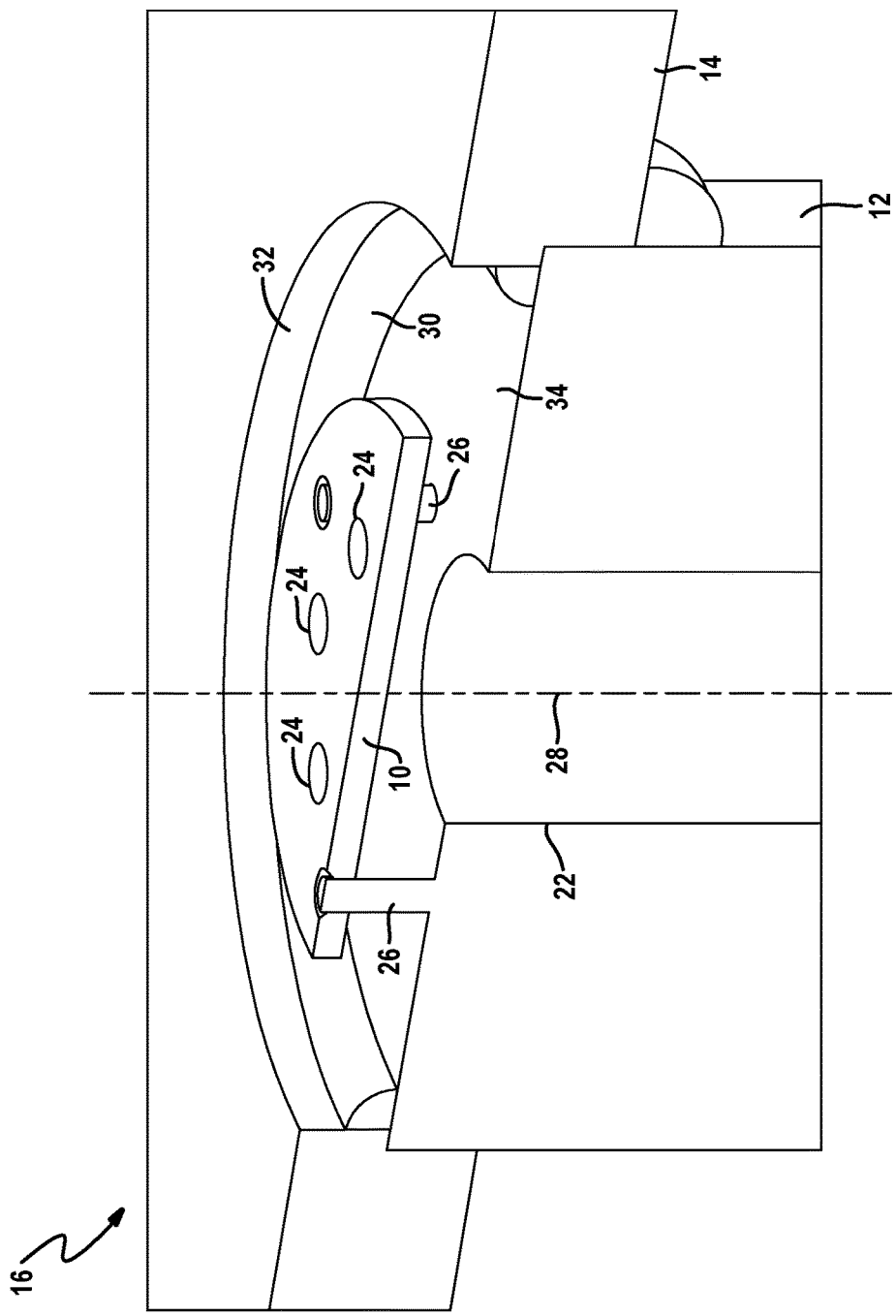
FIG. 1 is a cross-sectional perspective view of a baffle plate and corresponding stem and top plate of a showerhead assembly according to the prior art.
Figure 2:
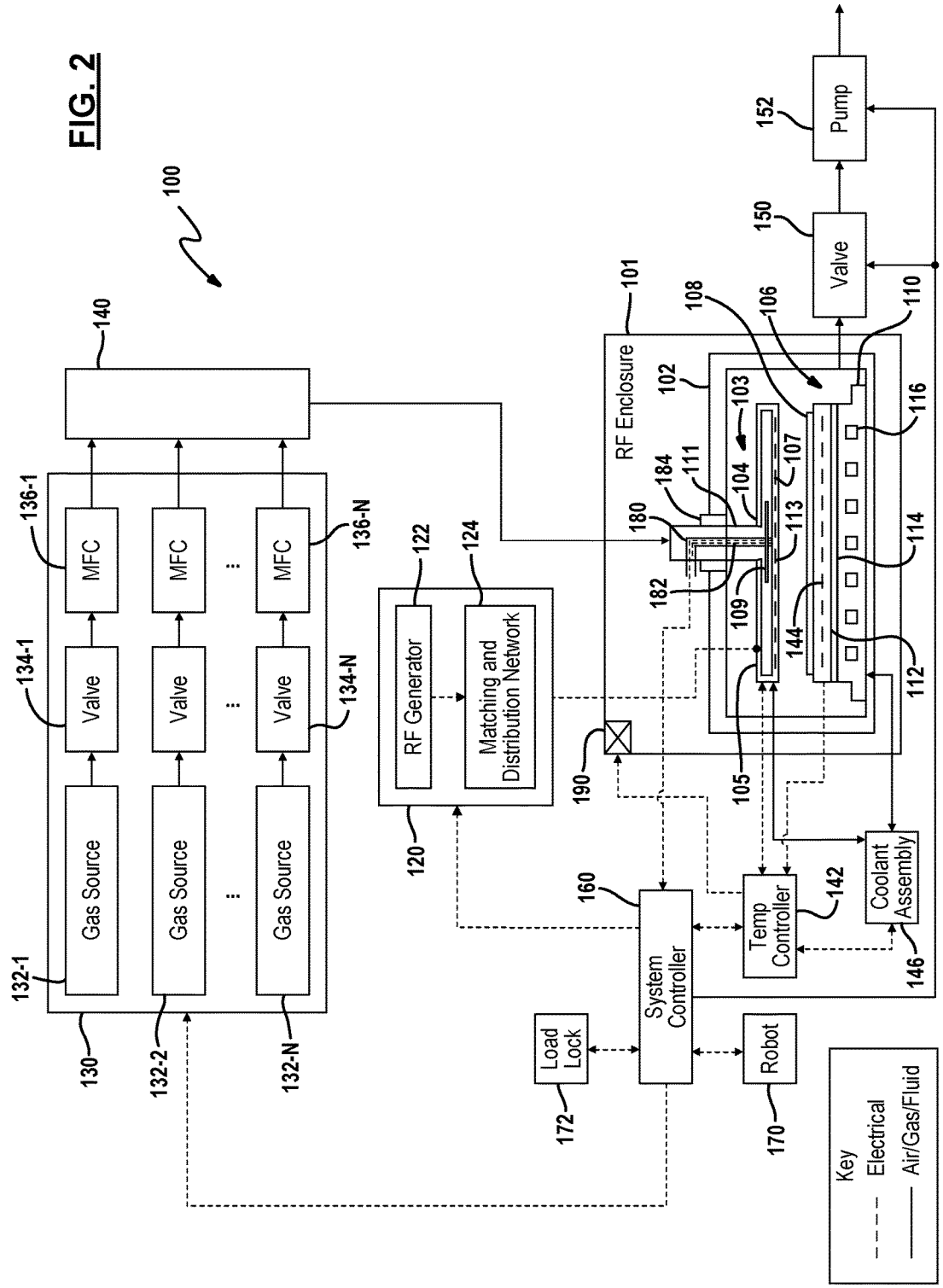
FIG. 2 is a functional block diagram of an example of a substrate processing system incorporating a baffle plate in accordance with an embodiment of the present disclosure.

FIG. 2 shows a substrate processing system 100 for performing etching using RF plasma. While a PECVD chamber is shown, the systems and methods described herein may be used in other processes. The substrate processing system 100 includes an RF enclosure 101 that may be at atmospheric pressure or another pressure. A processing chamber 102 is located in the RF enclosure 101. The processing chamber 102 encloses components of the processing chamber 102 and contains the RF plasma. The processing chamber 102 includes a showerhead assembly 103 that includes a showerhead 104 and a substrate support 106. The showerhead includes a top plate 105 and a bottom plate 107. During operation, a substrate 108 is arranged on the substrate support 106. A baffle plate 109 is disposed within the shower head 104 and between the plates 105, 107.

The showerhead 104 distributes gases and may operate as an upper electrode. The showerhead assembly 103 may further include a stem 111. The stem 111 includes a first end connected to a top surface of the processing chamber 102 and a second end connected to the showerhead 104. The showerhead 104 is generally cylindrical and extends radially outward from the second end of the stem 111 at a location that is spaced from the top surface of the processing chamber 102. The bottom plate 107 includes holes through which process or purge gas flows. The showerhead 104 may include heating elements 113. The showerhead 104 may also include cooling channels (not shown) that flow cooling gas or fluid.

The substrate support 106 includes a conductive baseplate 110 that acts as a lower electrode. The baseplate 110 supports a heating plate 112, which may be formed at least partially of a ceramic material. A thermal resistance layer 114 may be arranged between the heating plate 112 and the baseplate 110. The baseplate 110 may include one or more channels 116 for flowing coolant through the baseplate 110.

A RF generating system 120 generates and outputs RF power to the upper electrode (or showerhead) 104. The baseplate 110 may be DC grounded, AC grounded or at a floating potential. For example only, the RF generating system 120 may include an RF generator 122 that generates the RF power, which is fed by a matching and distribution network 124 to the upper electrode 104. In one embodiment, RF power is provided at two or more frequencies to the upper electrode 104. For example only, RF power is supplied at a first frequency (e.g., 13.56 mega-hertz (MHz)) and RF power is also supplied at a second frequency (e.g., 400 kilo-hertz (kHz)). The first frequency may be higher than an ion cut-off frequency to excite electrons and not ions in a plasma. The second frequency may be less than the ion cut-off frequency to excite both ions and electrons in the plasma.

A gas delivery system 130 includes one or more gas sources 132-1, 132-2, . . . , and 132-N (collectively gas sources 132), where N is an integer greater than zero. The gas sources 132 supply one or more precursors and mixtures thereof. The gas sources 132 may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the showerhead 104.

A temperature controller 142 may be connected to temperature controlled elements (TCEs) 144 arranged in the heating plate 112. Although shown separately from a system controller 160, the temperature controller may be implemented as part of the system controller 160. The temperature controller 142 may control the temperatures of the heating elements 113 and the TCEs 144 to control temperatures of the showerhead 104 and the substrate support 106, respectively. The temperature controller 142 may communicate with a coolant assembly 146 to control coolant through the channels 116 of the baseplate 110. For example, the coolant assembly 146 may include a coolant pump, a reservoir and flow control devices such as valves and/or mass flow controllers.

A valve 150 and pump 152 may be used to control pressure in the processing chamber 102 and to selectively evacuate reactants from the processing chamber 102. The system controller 160 may control components of the substrate processing system 100.

The showerhead 104 includes one or more thermocouples (one thermocouple 180 having conductors 182 is shown). The thermocouple 180 extends through the stem 111 and into the showerhead 104. The stem 111 is sealed to the processing chamber 102 via a seal 184. The conductors 182 are received at a filter assembly (not shown) and/or the system controller 160.

One or more fans 190 may be arranged in the RF enclosure 101 and used to maintain temperatures within the RF enclosure 101 at a predetermined temperature (e.g., 70° C.). The fans 190 may be turned ON and OFF by the temperature controller 142. The temperature controller 142 may control and adjust a duty cycle of control signals provided to each of the fans. The duty cycles may be adjusted based on temperatures detected in the RF enclosure 101 and/or via the thermocouple 180. For example, an ON time per cycle of a control signal of a fan may be increased when a detected temperature increases to provide additional cooling.

Figure 3:
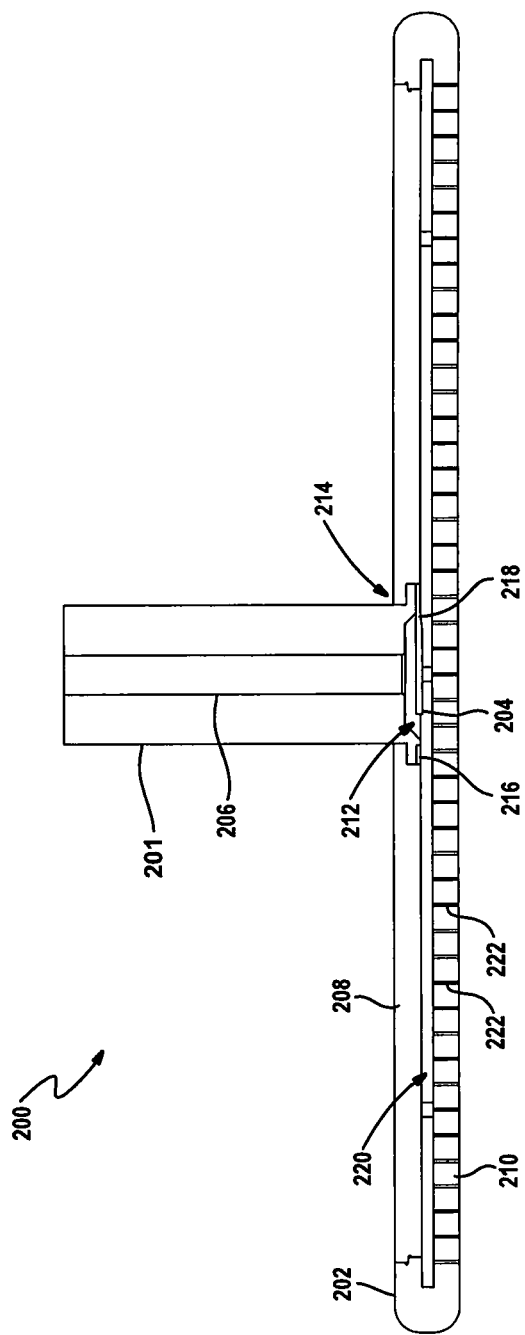
FIG. 3 is a cross-sectional side view of an example of a showerhead assembly including a baffle plate in accordance with an embodiment of the present disclosure.
Figure 4:
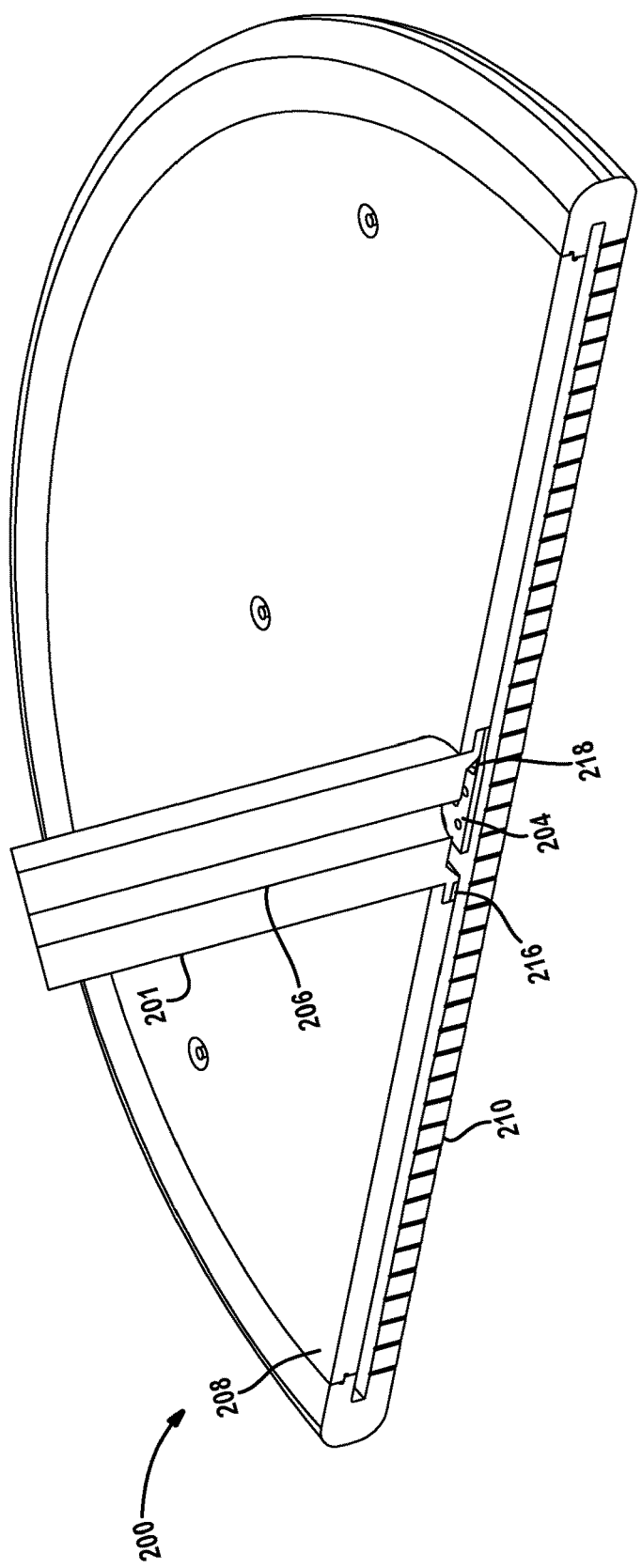
FIG. 4 is a cross-sectional perspective view of the showerhead assembly of FIG. 3.

FIGS. 3-4 show a showerhead assembly 200 in an upright orientation. The showerhead assembly 200 includes a stem 201, a showerhead 202 and a baffle plate 204. The stem 201 may extend from a chamber wall to the showerhead 202 and be used to supply gases to the showerhead 202 via an inner channel 206. The showerhead 202 includes a top plate 208 and a bottom plate 210. The baffle plate 204 is disposed in a recessed cavity 212 at an end 214 of the stem 201 and at least partially in the showerhead 202. The baffle plate 204 distributes gases received from the stem 201 across the bottom plate 210. The baffle plate 204 is attached to a ring 216 via one or more support members 218. The baffle plate 204, ring 216 and support members 218 may be referred to collectively as the baffle plate assembly. The gases pass from a second cavity 220 between the plates 208, 210 through holes 222 in the bottom plate 210.

Figure 5:
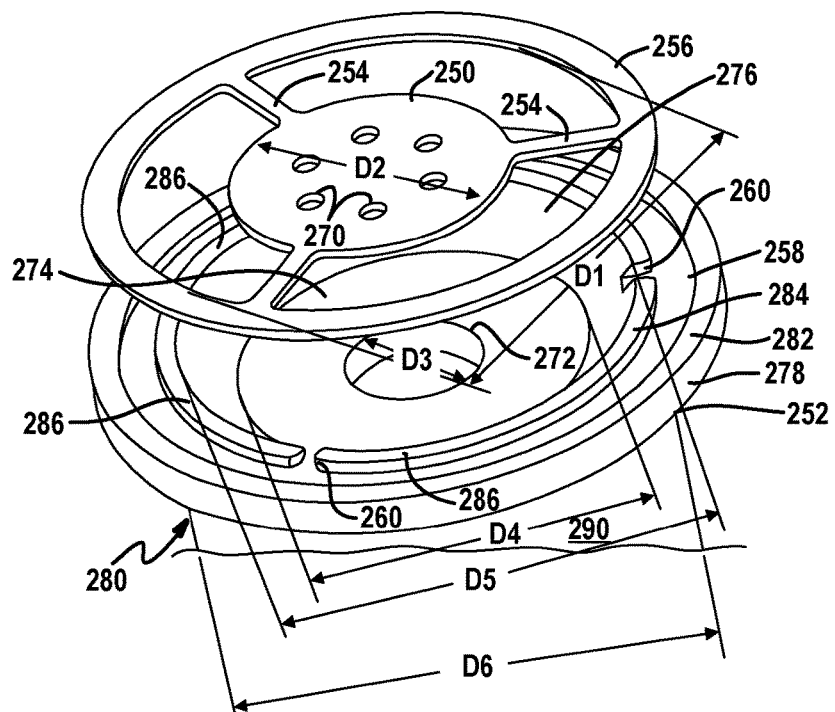
FIG. 5 is a perspective view of an example of a baffle plate and a portion of a stem in accordance with an embodiment of the present disclosure.

FIG. 5 shows a baffle plate 250 and a portion 252 of a stem. The baffle plate 250 is disc-shaped and is connected to support members 254. The support members 254 may be referred to as struts and laterally span between the baffle plate 250 and a ring 256. The ring 256 has an inner diameter D1 that is greater than an outer diameter D2 of the baffle plate 250. The ring 256 is placed in a corresponding ring channel 258 of the stem. Portions of the support members near the ring are placed in respective notches 260 of the stem. The ring 256 and support members 254 support the baffle plate 250 in a suspended position between the stem and an opposing bottom plate of a showerhead (e.g., one of the showerheads disclosed herein). The ring 256 and support members 254 allow the baffle plate 250 to be excluded from attachment processes attaching the ring 256 and/or support members 254 to the stem, which reduces damage to the baffle plate 250.

The baffle plate 250 is perforated to include holes 270 for passage of gas therethrough. There may be any number of the support members connecting the baffle plate 250 to the ring 256. The baffle plate 250, support members 254 and ring 256 may be formed of the same material or different materials. In one embodiment, the baffle plate 250, support members 254 and ring 256 are formed as a single component. In another embodiment, the baffle plate 250, support members 254 and ring 256 are machined from a same piece of stock material (e.g., a block of aluminum). The baffle plate 250, support members 254 and ring 256 may be formed of aluminum, copper, and/or other suitable materials. In one embodiment, the baffle plate 250, support members 254 and ring 256 are formed of 6061 grade aluminum.

The stem may include a collar 278, a recessed surface 274 and a tapered surface 276. The outer diameter D2 of the baffle plate 250 may be greater than a diameter D3 of an inner channel 272 of the stem and smaller than an outer diameter D4 of the recessed surface 274 and/or an outer diameter D5 of the tapered surface 276. The collar 278 is on an end 280 of the stem near the showerhead and includes the ring channel 258 and notches 260. The support members 254 may extend in, but is not limited to, a horizontal direction when the stem is vertically oriented, such that the inner channel 272 is extending in a vertical direction.

The ring channel 258 is shaped and sized to match an exterior of the ring 256. The notches 260 are disposed along the ring channel 258 and are shaped and sized to match corresponding portions of the support members 254. The ring channel 258 is disposed between an outer circumferential ridge 282 and an inner circumferential ridge 284. The outer circumferential ridge 282 can be part of either the stem 280 or the mating top plate (one of the top plates disclosed herein). The inner circumferential ridge 284 is segmented (i.e. not continuous) due to the notches 260 between segments 286 of the inner circumferential ridge 284. The ridges face a bottom plate of a corresponding showerhead. The tapered surface 276 extends between the inner circumferential ridge 284 and the recessed surface 274. The outer diameter D4 of the recessed surface 274 is smaller than an outer diameter D6 of a main body 290 of the stem. The recessed surface 274 faces the baffle plate 250. The inner channel 272 of the stem passes through the recessed surface 274. Gases flow from the inner channel 272 towards the baffle plate 250.

Figure 6:
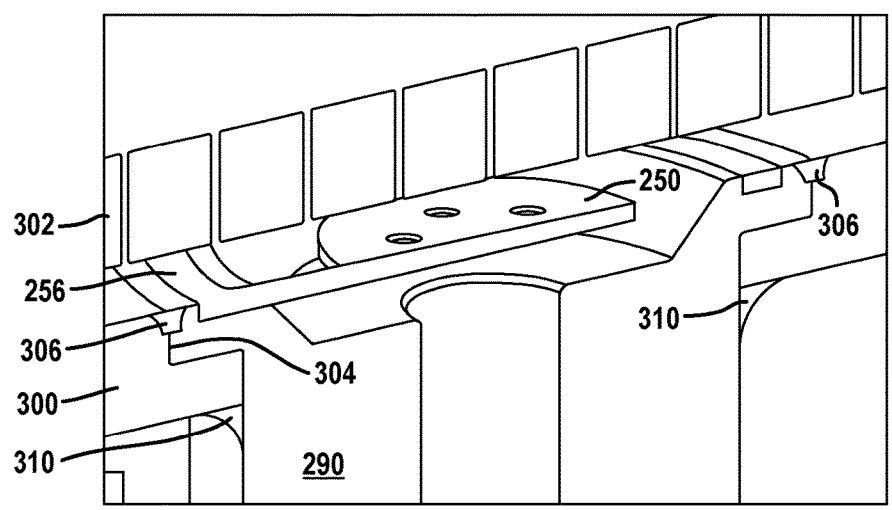
FIG. 6 is a cross-sectional perspective view of an example of the baffle plate and stem of FIG. 4 and corresponding top plate.
Figure 7:
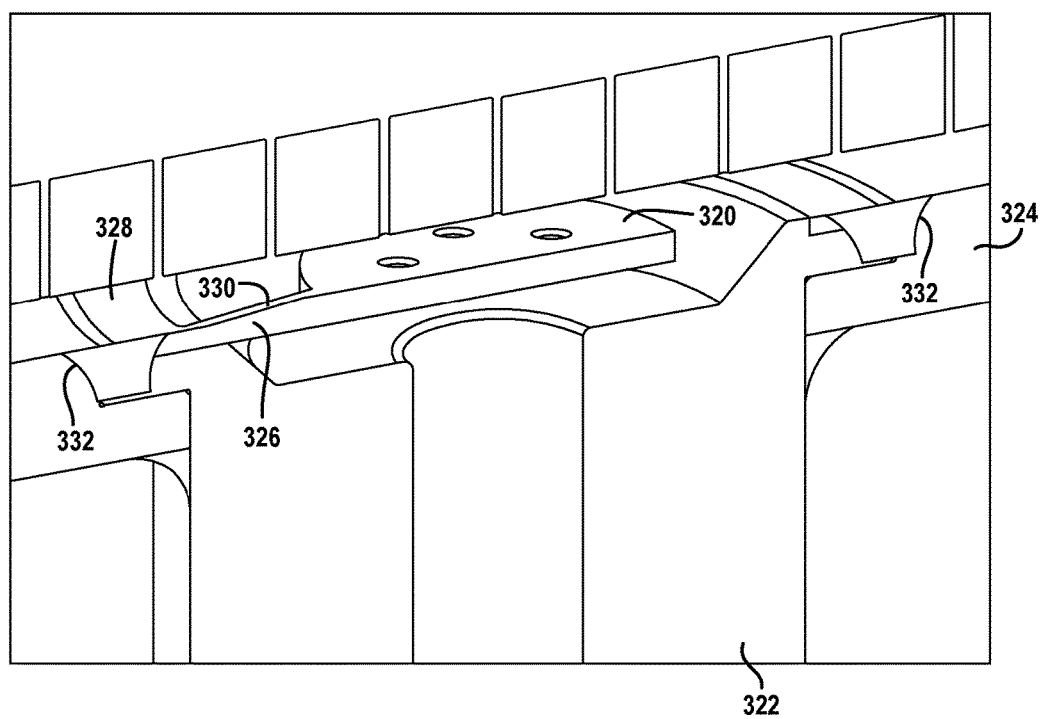
FIG. 7 is a cross-sectional perspective view of an example of another baffle plate, stem and top plate in accordance with an embodiment of the present disclosure.
Figure 8:
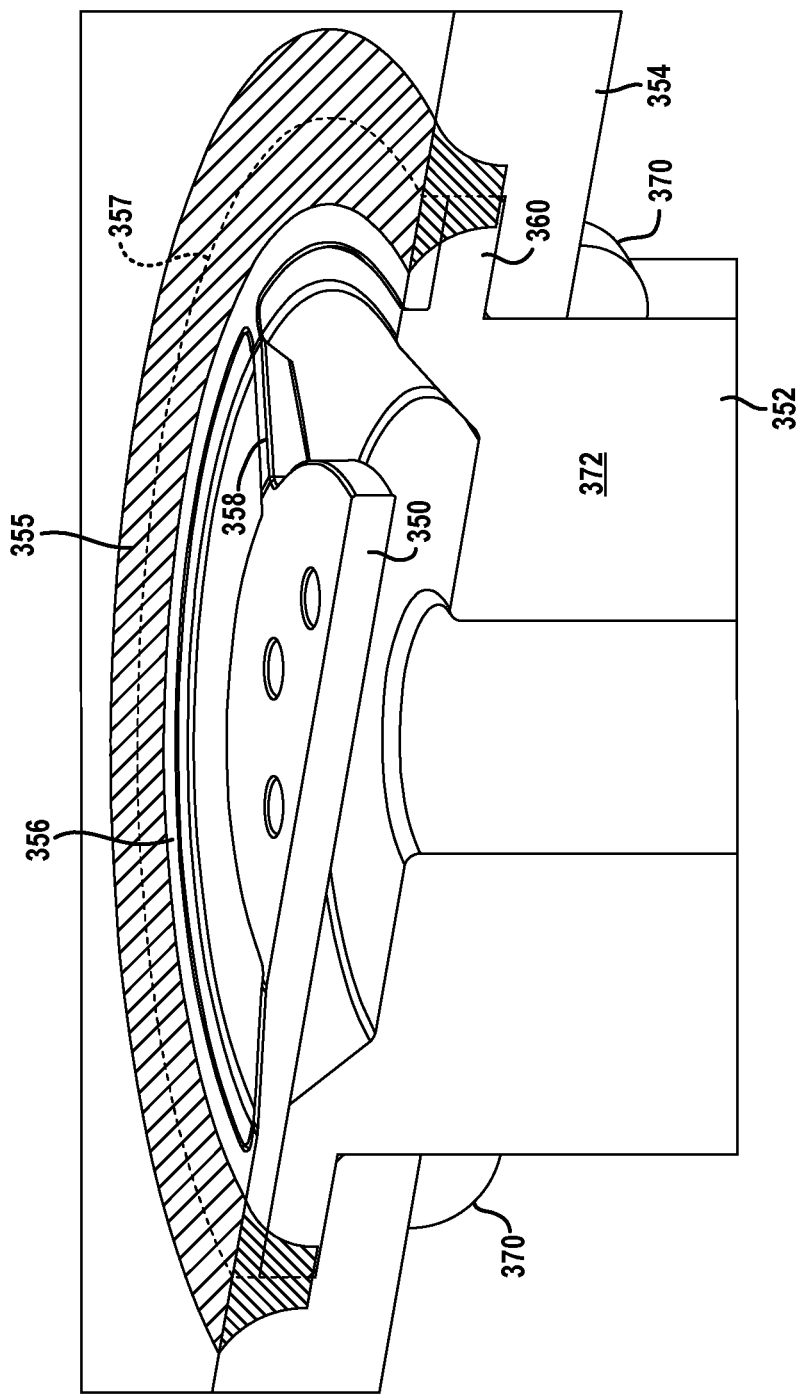
FIG. 8 a cross-sectional perspective view of an example of another baffle plate, stem and top plate illustrating welds in accordance with an embodiment of the present disclosure.

The ring 256 may be friction stir welded to the stem and/or a top plate (one of the top plates disclosed herein). The stem may be friction stir welded to the top plate. The stated welding may be accomplished via one or more welds. The friction stir welding provides a permanent fusion of two or more components using a single welding operation. Examples of the welds are shown in FIGS. 6-8. In one embodiment, the ring 256 and/or support members 254 are swaged to the stem via swage tabs formed, for example, in the stem. The swage tabs may be used as alternative or in addition to welding. This is further described below with respect to FIGS. 9 and 11-15.

In another embodiment, the ring 256 and/or the support members 254 are sized to provide a thermal interference fit (i) between the ring 256 and the ring channel 258, and/or (ii) between portions of the support members 254 and the notches 260. During assembly, the ring 256 and/or the support members 254 may be heated or cooled and placed in the ring channel 258 and notches 260. Once placed in the ring channel 258 and the notches 260, the ring 256, the support members 254, the stem and/or the collar 278 of the stem may be heated or cooled to allow the ring 256 and/or the support members to be inserted in the ring channel 258 and the notches 260. Upon returning to an ambient temperature, the ring 256 and support members 254 are locked in the ring channel 258 and notches 260. In another embodiment, the ring 256 and/or the support members 254 are locked into place as described and then the ring 256 is friction stir welded to the collar 278 and/or the corresponding top plate.

FIG. 6 shows the baffle plate 250 and stem of FIG. 5 and a corresponding top plate 300. As shown, the baffle plate 250 is suspended between the stem and a bottom plate 302. The ring 256 may be friction stir welded to the collar 278 and the top plate 300 along an inner circumferential surface 304 of the top plate 300. The weld provided by the friction stir welding process is circular, although shown in FIG. 6 as a couple of trapezoidally-shaped patches 306 with curved sides. The baffle plate and stem are shown prior to friction stir welding. The trapezoidally-shaped patches 306 represent cross-sectional areas of the weld to be formed. The whole circular weld is not shown. A circular weld provided by friction stir welding is shown in FIG. 8. The top plate may be tungsten inert gas (TIG) welded to the main body 290 of the stem. This is illustrated by triangular-shaped slices 310. Multiple TIG welds may be provided along the circumferential perimeter of the stem. A continuous TIG weld may not be provided along the circumferential perimeter of the stem.

FIG. 7 shows another baffle plate 320, a stem 322 and top plate 324 in an upside down orientation. The baffle plate 320 is held in place by support members 326 (only one shown in FIG. 6), which are connected to a ring 328. The support members 326 may be tapered, such that the support members 326 are thicker near the baffle plate 320 than near the ring 328. In the example shown, top surfaces of the baffle plate 320, the support members 326, and the ring 328 are in a same plane. Bottom sides of the support members 326 include additional material, such that bottom surfaces 330 of the support members 326 are tapered to provide the varying thicknesses between the baffle plate 320 and the ring 328. The tapered bottom surfaces restore and/or have minimal effect on an original flow path of gases while reducing a risk of affecting a substrate process (e.g., etching process) being performed. The tapered bottom surfaces also increase rigidity of the baffle plate 320. Trapezoidally-shaped patches 332 representing cross-sectional areas of a weld that is to be provided by friction stir welding are also shown.

FIG. 8 shows another baffle plate 350, stem 352 and top plate 354 illustrating a circular weld 355 provided from friction stir welding along a line 357. In the example shown, the baffle plate 350 is connected to a ring 356 via support members 358. Portions of (i) a collar 360 of the stem 352, (ii) the ring, and (iii) the top plate 354 are friction stir welded together to provide the circular weld 355 along a) an outer circumferential perimeter of the ring 356, b) an outer circumferential perimeter of the collar 360, and c) an inner circumferential perimeter of the top plate 354. The line 357 corresponds to a) the outer circumferential perimeter of the ring 356, b) the outer circumferential perimeter of the collar 360, and c) the inner circumferential perimeter of the top plate 354. During friction stir welding, a friction stir welding pin is heated and inserted into and/or (i) between the ring 356 and the top plate 354, and (ii) between the collar 360 and the top plate 354. The friction stir welding pin is moved in a circular direction along a) an outer circumferential perimeter of the ring 356, b) an outer circumferential perimeter of the collar 360, and c) an inner circumferential perimeter of the top plate 354. This creates the circular weld 355. TIG welds 370 are also shown between the top plate 354 and a body of the stem 352. One or more TIG welds may be included around the circumferential perimeter of the main body 372. The friction stir welding removes vertical seams between the ring and the top plate and between the stem and the top plate.

Figure 9:
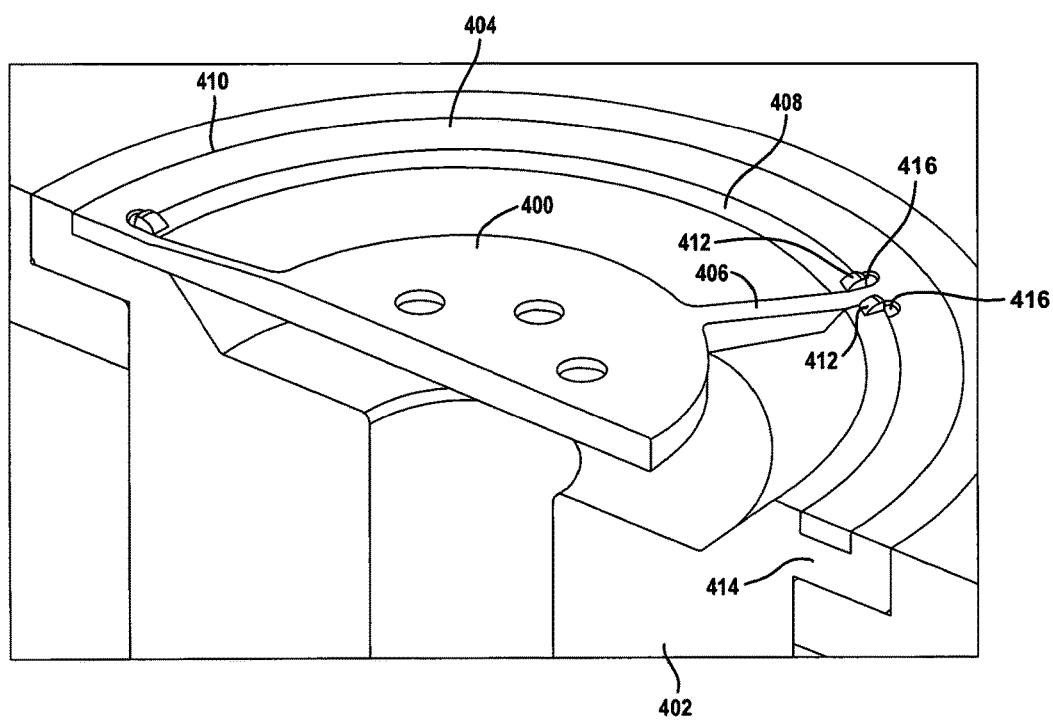
FIG. 9 is a cross-sectional perspective view of an example of a swage tab locking implementation in accordance with an embodiment of the present disclosure.

FIG. 9 shows a swage tab locking implementation for a baffle plate 400 and stem 402. The baffle plate 400 is attached to a ring 404 via support members 406. The stem 402 includes a segmented inner circumferential ridge 408 that extends along a ring channel 410. The segmented inner circumferential ridge 408 includes swage tabs 412 that extend below bottom surfaces of a collar 414 of the stem 402 and a bottom surface of the ring 404. The ring 404 includes swage tab notches 416 opposing respectively the swage tabs 412. The swage tabs 412 are pressed and/or compressed into the swage tab notches 416 of the ring 404 to lock the ring 404 in the ring channel 410.

Figure 10:
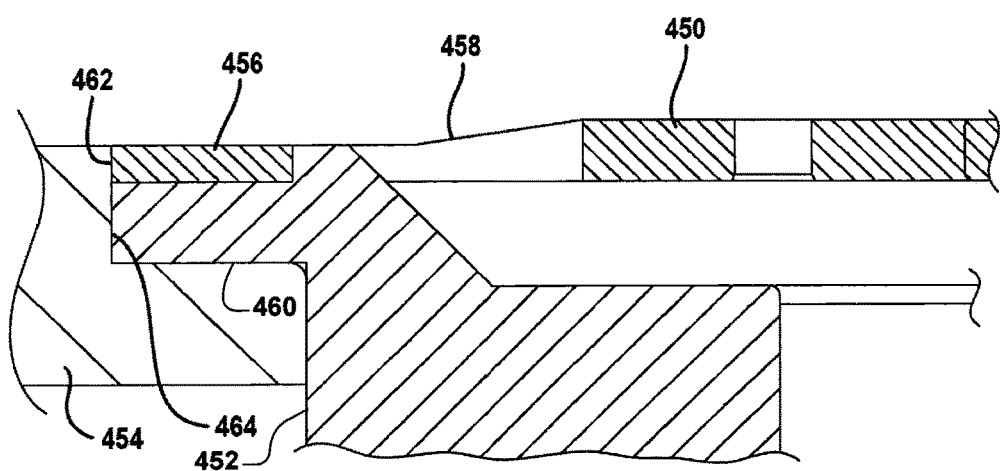
FIG. 10 is a side half cross-sectional view of an example baffle plate, stem and top plate with a ring of the baffle plate abutting the top plate in accordance with an embodiment of the present disclosure.

FIG. 10 shows a side half cross-sectional view of an example baffle plate 450, stem 452 and top plate 454 with a ring 456 of the baffle plate 450 abutting the top plate 454. The baffle plate 450 is connected to the ring 456 via support members 458 (only one is shown in FIG. 10). The stem 452 includes a collar 460. In this example, no portion of the collar 460 is between the ring 456 and the top plate 454, unlike the examples of FIGS. 5-7 and 9. The example of FIG. 10 is similar to the examples of FIGS. 3-4 and 8. An outer circumferential edge 462 of the collar 460 abuts a bottom portion of an inner circumferential surface 464 of the top plate 454.

Figure 11:
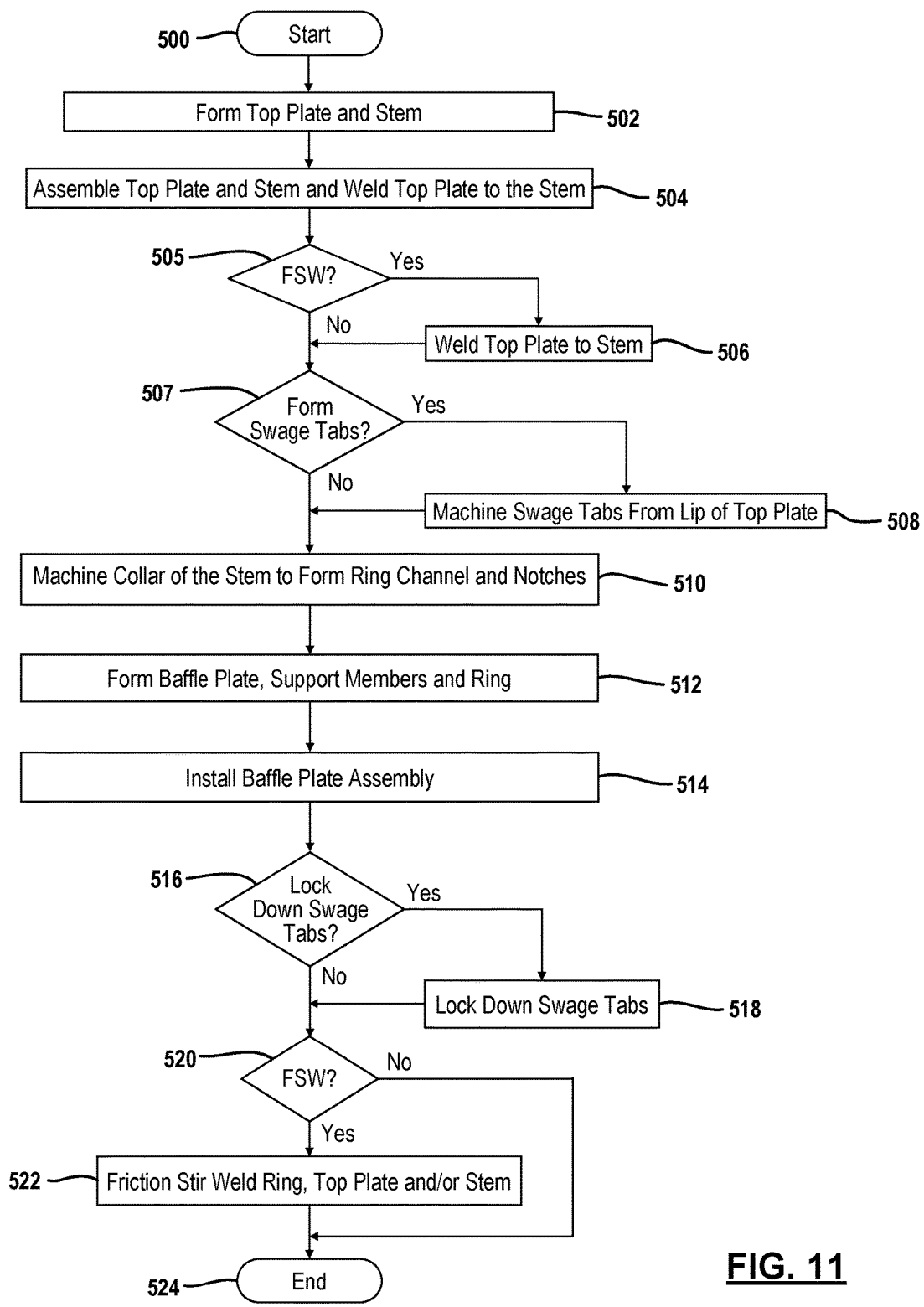
FIG. 11 illustrates an example method of manufacturing and assembling a baffle plate assembly, a stem and a top plate of a showerhead assembly in accordance with an embodiment of the present disclosure.

FIG. 11 illustrates an example method of manufacturing and assembling a baffle plate assembly, a stem and a top plate of a showerhead assembly. Although the following tasks are primarily described with respect to FIGS. 12-16, the tasks may be performed and/or easily modified to apply to other implementations of the present disclosure. The tasks may be iteratively performed. The tasks may be performed by the manufacturing system 600 of FIG. 16. These tasks are provided as examples. The baffle plate, stem and top plate may be formed and assembled using other suitable techniques.

The method may begin at 500. At 502, a top plate (e.g., top plate 601 or other top plate disclosed herein) and a stem (e.g., stem 602 or other stem disclosed herein) are formed. The top plate is formed having a stepped hole (e.g., hole 604) with a recessed ledge (e.g., ledge 606). The stem is formed having a collar (e.g., collar 608) and may include a lip (e.g., lip 610). The lip extends below a bottom surface (e.g., surface 612) of the collar and near a tapered surface (surface 614) of the stem. The top plate and stem may be formed via the automated milling machine 616 (e.g., a computer numerical control milling machine) of FIG. 16. The top plate and stem may be transferred from the automated milling machine via a first robot to an assembly booth 620. Other techniques may be used to transfer the top plate and stem to the assembly booth 620 and may include a conveyer.

At 504, a top plate and stem are assembled. The assembling of the top plate and stem may occur in an assembly booth 620. During assembly, a main body (e.g., body 626) of the stem may be inserted into the stepped hole in the top plate and slid through the stepped hole until a top surface (surface 628) of the collar is in contact with the bottom surface of the recessed ledge.

Figure 12:
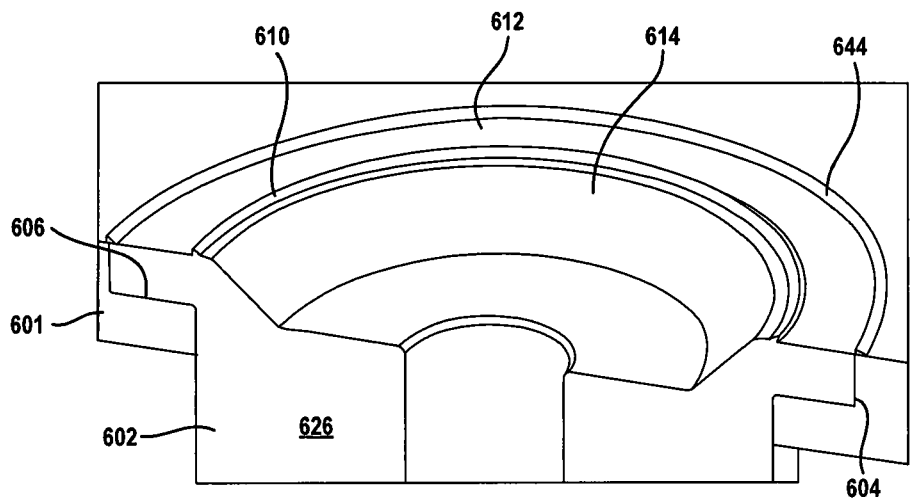
FIG. 12 is a cross-sectional perspective view of an example of a stem and a top plate in accordance with an embodiment of the present disclosure.

At 505, it is determined whether the top plate is to be welded to the stem. If the top plate is to be welded to the stem task 506 is performed, otherwise task 507 is performed. At 506, the top plate is welded to the stem, as shown in FIG. 12. This may include welding the top plate to the collar of the stem and may include welding the top plate to the main body of the stem. Prior to performing task 506, the assembled top plate and stem may be transferred from the assembly booth to the friction stir welding machine 622 via a second robot 624 to friction stir weld the top plate to the collar. Other techniques may be used to transfer the assembled top plate and stem from the assembly booth 620 to the friction stir welding machine 622 and may include a conveyer. Task 507 is performed subsequent to task 506.

Figure 13:
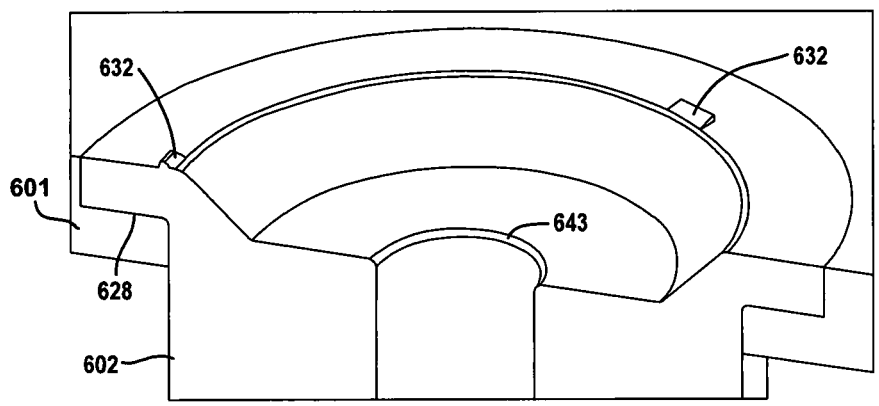
FIG. 13 is a cross-sectional perspective view of the stem and the top plate of FIG. 12 illustrating swage tabs in accordance with an embodiment of the present disclosure.
Figure 14:
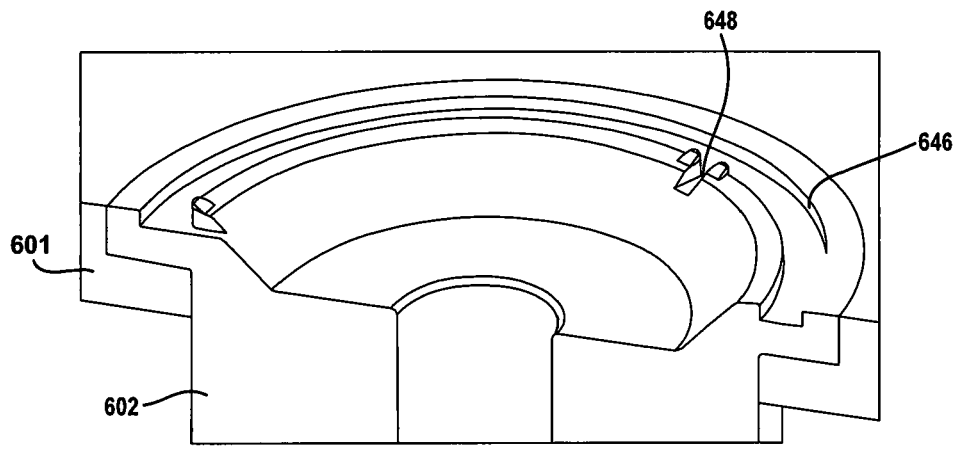
FIG. 14 is a cross-sectional perspective view of the stem and the top plate of FIG. 12 illustrating a ring channel and support member notches in accordance with an embodiment of the present disclosure.

At 507, it is determined whether swage tabs are to be formed. This determination may be made by controller 630. The controller 630 may control the automated milling machine 616, the robots 618, 624, the assembly machine 621, the friction stir welding machine 622 and/or a pressing machine 641. The pressing machine 641 (e.g., a press) may be located in a pressing booth 642. If swage tabs are to be formed, task 508 is performed, otherwise task 510 may be performed. At 508, swage tabs (e.g., swage tabs 632) are machined from the lip extending below the bottom surface of the collar. This includes machining away material from the lip to provide the swage tabs. The swage tabs may be angled to deform radially outward to center the baffle plate below an inner channel (e.g., inner channel 643) of the stem and pull the baffle plate into slight tension when compressed. The resulting swage tabs are shown in FIG. 13. The assembled top plate and stem may be returned to the automated milling machine 616 for the machining performed at 508. This task may include clean-up to machine away flashing (e.g., flashing 644) remaining below the top plate and/or collar as a result of friction stir welding. At 510, the collar of the stem is machined to form a ring channel (e.g., ring channel 646) and notches (e.g., notches 648) for support members via the automated milling machine 616, as shown in FIG. 14.

At 512, a baffle plate (e.g., baffle plate 650), support members (e.g., support members 652) and ring (e.g., ring 654) are formed. Task 512 may be performed at the automated milling machine 616 and prior to and/or while any of tasks 502-510 are performed. The automated milling machine 616 may be a 5-axis milling machine and the baffle assembly may be formed from bar stock. The baffle plate, support members and ring may be formed as a single component (or baffle plate assembly) and may be formed of one or more materials as described above. Task 512 may include forming swage tab notches (e.g., notches 656) for the swage tabs.

Figure 15:
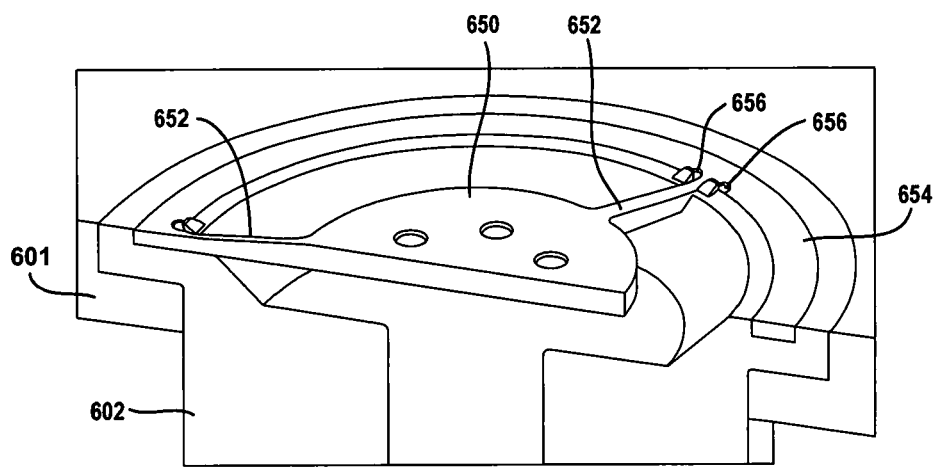
FIG. 15 is a cross-sectional perspective view of the stem and the top plate of FIG. 12 illustrating installation of a baffle plate in accordance with an embodiment of the present disclosure.
Figure 16:
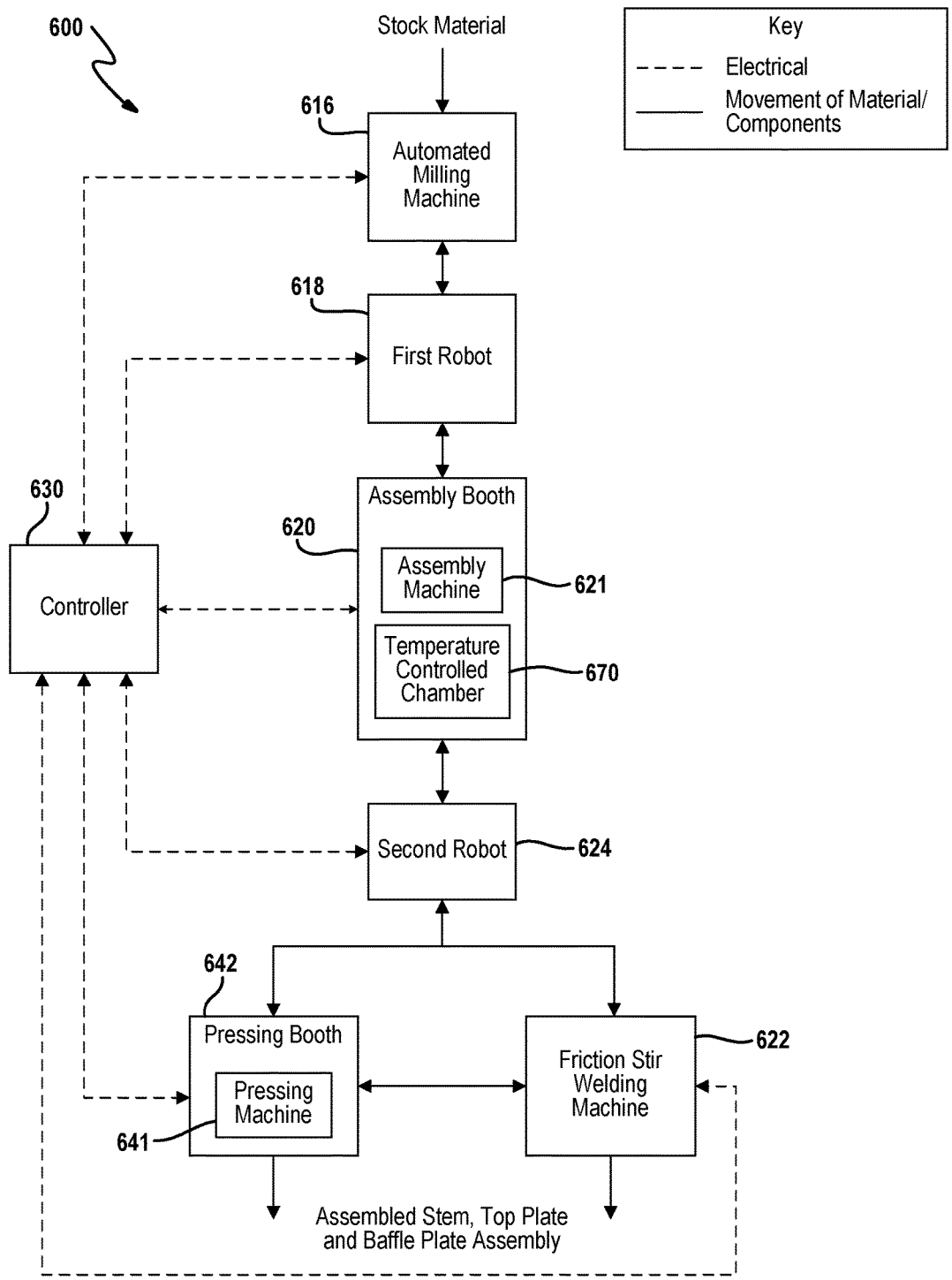
FIG. 16 is a block diagrammatic view of an example of a manufacturing system in accordance with an embodiment of the present disclosure.

At 514, the baffle plate assembly is installed on the stem, as shown in FIG. 15. This may occur in the assembly booth 620. This may include placing the ring in the ring channel and the support members in the notches of the collar. If the ring is sized to provide a thermal interference fit with the ring channel, the ring and/or collar of the stem may be heated or cooled to allow the ring to be inserted into the ring channel. This may occur in, for example, a temperature controlled chamber 670. The temperature controlled chamber may be an oven or a chiller. Although the temperature controlled chamber 670 is shown, the ring and/or collar may be heated or cooled using another suitable technique. The ring and/or collar may be heated or cooled depending on the shape of the ring and collar and/or a coupling arrangement between the ring and the collar. The ring and/or collar may be heated or cooled depending on whether the ring is inserted into the collar as shown. This is one example coupling arrangement, other coupling arrangements may be implemented. In one embodiment, the ring and/or collar is cooled to allow the ring to be inserted into the ring channel of the collar. Temperature of the temperature controlled chamber may be controlled by the controller 630. The ring may be locked in the ring channel upon the ring and/or collar returning to an ambient temperature.

If the support members are sized to provide a thermal interference fit with the notches of the collar, the support members and/or collar of the stem may be heated or cooled to allow the support members to be inserted into the notches of the collar. This may occur in, for example, the temperature controlled chamber 670. The support members may be locked in the notches of the collar upon the support members and/or collar returning to an ambient temperature.

At 516, it is determined whether swage tabs are to be locked down. This determination may be made by the controller 630. If swage tabs are to be locked down, task 518 is performed, otherwise task 520 is performed. At 518, the swage tabs of the stem may be pressed and/or compressed into the swage tab notches to lock the ring in the ring channel. This may include pinching both (i) ends of the support members, and (ii) the ring. This may be performed in the pressing booth 642 via the pressing machine 641. This technique of locking down the ring has little to no effect on gas flow in a corresponding showerhead. During use of the assembled stem, top plate and baffle plate assembly, Aluminum Fluorine (AlF) growth due to remote plasma cleaning (RPC) fluorine further secures the ring and support members to the stem and interlocks them on a microscopic scale.

At 520, it is determined whether friction stir welding is to be performed. If friction stir welding is to be performed, task 522 is performed, otherwise the method may end at 524. At 522, the ring is friction stir welded to the top plate and/or collar of the stem to provide a single weld. This may occur in the friction stir welding machine 622. The top plate may be friction stir welded to the collar of the stem. This may be a result of the single weld or may be a second weld. Task 522 may include one or more welds.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

Figure 17:
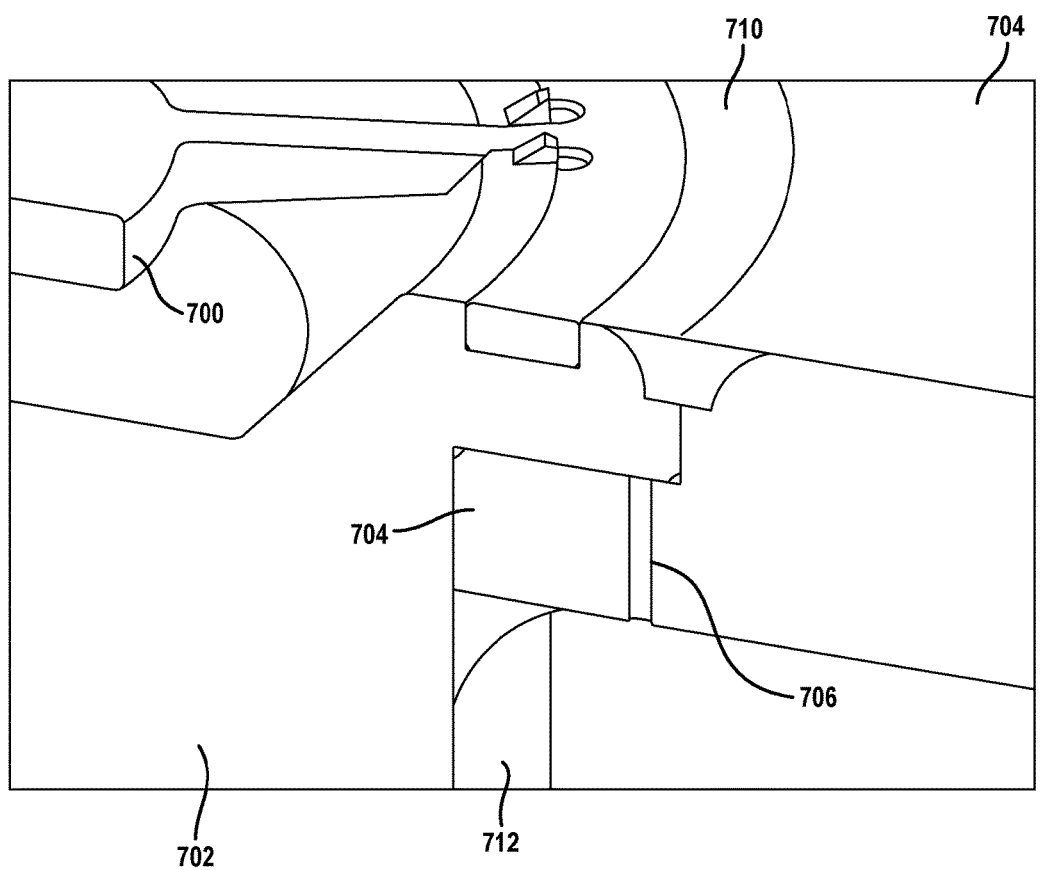
FIG. 17 is a cross-sectional perspective view of portions of a baffle plate, a stem and a top plate, where the top plate has vent holes in accordance with an embodiment of the present disclosure.

FIG. 17 shows portions 700, 702, 704 of a baffle plate, a stem and a top plate. The top plate includes vent holes (one vent hole 706 is shown). The top plates disclosed herein may include one or more vent holes as shown. The vent holes may be provided for trapped material and/or gasses due to full-radial welds. In one embodiment, the vent holes are not included. The vent holes may be provided in a ridge 708 of the top plate 704 above a collar 710 of the stem 702. The vent holes may extend vertically and/or parallel to a body 712 of the stem 702.

Some of the above-described examples include friction stir welding, which: provides structural support; eliminates internal trapped material; and provides a consistent and repeatable weld. The seams between components are eliminated by the friction stir welding process to provide uniform geometry with no ability for gas intrusion in the weld. The welds provided by friction stir welding are stronger than traditional baffle plate welds and have a reduced potential for fluorine attack and degradation during use of the corresponding baffle plates. The friction stir welding also eliminates the need for filler material and reduces time and costs associated with the stated welding.

Although friction stir welding is described, some of the examples do not include friction stir welding and/or any welding. This eliminates welding any portion of a baffle plate assembly. By performing friction stir welding or by not performing any welding, some of the disclosed examples eliminate a need for welding filler material (e.g., Si welding filler material). Also, since the baffle plates disclosed herein are not welded, weld clean-up of the baffle plates is not needed. The rings disclosed herein may be welded and/or deformed without affecting the corresponding baffle plates. The rings provide a larger surface for welding than traditional standoff members. The rings may be friction stir welded as described above or may be welded using other welding techniques, such as TIG welding, spot welding, etc. The rings can be cleaned up and finished without impacting baffle plate geometry and/or surfaces. This allows a finish of a baffle plate to not be altered during attachment of a baffle plate assembly to a stem or other component of a showerhead, as further described below.

Although the disclosed examples show the support members formed to be placed in notches of a collar of a stem, the support members may be formed to be placed elsewhere in the stem and/or showerhead. This allows placement of the baffle plate in other locations within the showerhead. For example, a ring and corresponding support members may be placed within a ring channel and notches machined in a top plate or a bottom plate of a showerhead. The method of FIG. 11 may be modified to include machining of the ring channel and notches in a top plate or bottom plate rather than in an end of a stem. The top plate and/or bottom plate may be formed, such that the baffle plate is held by the ring and support members in a position located between the top plate and the bottom plate. The position of the baffle plate may be anywhere in the showerhead.

Further, various embodiments are disclosed herein. Although each of the embodiments are described as having certain features, any one or more of the features described with respect to any one embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. When a first element is adjacent to a second element, the first element may be in contact with the second element or the first element may be spaced away from the second element without any intervening element between the first element and the second element. When a first element is between a second element and a third element, the first element may be directly connected to the second element and the third element (referred to as "directly between") or intervening elements may be connected (i) between the first element and the second element, and/or (ii) between the first element and the third element. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A baffle plate assembly comprising:
    a baffle plate having an outer diameter and configured to receive gases from a stem of a showerhead assembly and distribute the gases through a showerhead of the showerhead assembly of a substrate processing system;
    a ring having an inner diameter and configured to be disposed in a ring channel of the showerhead assembly, wherein the inner diameter is greater than the outer diameter of the baffle plate; and
    a plurality of support members extending from the baffle plate to the ring,
    wherein the ring and the plurality of support members are configured to hold the baffle plate in a position between a top plate and a bottom plate of the showerhead.

2. The baffle plate assembly of claim 1, wherein the plurality of support members are configured to be placed in notches in a collar of the stem of the showerhead assembly.

3. The baffle plate assembly of claim 1, wherein the baffle plate comprises a plurality of holes through which portions of the gases pass.

4. The baffle plate assembly of claim 1, wherein each of the plurality of support members is thicker at the baffle plate than at the ring.

5. The baffle plate assembly of claim 1, wherein the plurality of support members comprise a tapered bottom surface.

6. The baffle plate assembly of claim 1, wherein each of the plurality of support members comprises:
    a top surface extending parallel to a bottom surface of the stem or a bottom surface of the top plate of the showerhead; and
    a tapered bottom surface.

7. The baffle plate assembly of claim 1, wherein a top surface of the baffle plate, top surfaces of the plurality of support members, and a top surface of the ring are in a same plane.

8. A showerhead assembly comprising:
    the baffle plate assembly of claim 1; and
    the showerhead,
    wherein
        the baffle plate receives the gases from the stem of the showerhead assembly and distributes the gases through the showerhead,
        the ring is disposed in the ring channel of the showerhead assembly, and
        the ring and the plurality of support members hold the baffle plate in the position between the top plate and the bottom plate of the showerhead.

9. The showerhead assembly of claim 8, further comprising the stem,
    wherein the top plate is connected to the stem and comprises the ring channel.

10. The showerhead assembly of claim 9, wherein:
    the stem comprises notches; and
    a portion of each of the plurality of support members is placed in a respective one of the notches.

11. The showerhead assembly of claim 10, wherein the portions of the plurality of support members have a thermal interference fit with the notches.

12. The showerhead assembly of claim 9, wherein the ring is welded to the stem or the top plate.

13. The showerhead assembly of claim 9, wherein the ring is friction stir welded to the stem and the top plate.

14. The showerhead assembly of claim 9, wherein:
    the ring is friction stir welded to the stem; and
    the stem is friction stir welded to the top plate.

15. The showerhead assembly of claim 9, wherein:
    the stem comprises swage tabs;
    the ring comprises notches; and
    the swage tabs are pressed at least partially into the notches of the ring.

16. The showerhead assembly of claim 9, wherein the ring has a thermal interference fit with the ring channel.

17. The showerhead assembly of claim 9, wherein the ring abuts the top plate of the showerhead.

18. A method comprising:
    forming a top plate for a showerhead of a showerhead assembly of a substrate processing system;
    forming a stem of the showerhead assembly;
    forming a baffle plate assembly including a baffle plate, a ring and a plurality of support members, wherein the plurality of support members extend from the baffle plate to the ring;
    sliding the top plate on to the stem;
    placing the ring in a ring channel of the showerhead assembly to suspend the baffle plate between (i) the stem or the top plate of the showerhead, and (ii) a bottom plate of the showerhead; and
    locking the ring in the ring channel.

19. The method of claim 18, further comprising welding the ring to the stem or the top plate.

20. The method of claim 18, further comprising friction stir welding the ring to the stem and to the top plate.

21. The method of claim 18, wherein the locking of the ring in the ring channel comprises:
   forming swage tabs in a collar of the stem;
   forming notches in the ring; and
   pressing or compressing the swage tabs at least partially into the notches of the ring to lock the ring in the ring channel.

22. The method of claim 18, wherein the locking of the ring in the ring channel comprises:
   prior to placing the ring in the ring channel, heating the ring or a portion of the stem to allow the ring to be placed in the ring channel; and
   allowing the ring or the portion of the stem to return to an ambient temperature to lock the ring in the ring channel.

23. The method of claim 18, wherein the locking of the ring in the ring channel comprises:
   prior to placing the ring in the ring channel, cooling the ring or a portion of the stem to allow the ring to be placed in the ring channel; and
   allowing the ring or the portion of the stem to return to an ambient temperature to lock the ring in the ring channel.

24. The method of claim 18, further comprising locking the plurality of support members in notches of the stem, wherein the locking of the plurality of support members comprises:
   prior to placing the ring in the ring channel, heating the plurality of support members or a portion of the stem to allow the plurality of support members to be placed in the notches; and
   allowing the plurality of support members or the portion of the stem to return to an ambient temperature to lock the plurality of support members in the notches.

25. The method of claim 18, further comprising locking the plurality of support members in notches of the stem, wherein the locking of the plurality of support members comprises:
   prior to placing the ring in the ring channel, cooling the plurality of support members or a portion of the stem to allow the plurality of support members to be placed in the notches; and
   allowing the plurality of support members or the portion of the stem to return to an ambient temperature to lock the plurality of support members in the notches.

* * * * *